United States Patent [19]

Kuriyama et al.

[11] Patent Number: 6,113,760
[45] Date of Patent: Sep. 5, 2000

[54] POWER SUPPLY APPARATUS FOR SPUTTERING AND A SPUTTERING APPARATUS USING THE POWER SUPPLY APPARATUS

[75] Inventors: Noboru Kuriyama, Yokohama; Yutaka Yatsu, Sagamihara; Nobuaki Utsunomiya, Kamakura; Yuji Yasumoto, Zama, all of Japan

[73] Assignee: Shibaura Mechatronics Corporation, Yokohama, Japan

[21] Appl. No.: 09/355,450

[22] PCT Filed: Feb. 19, 1998

[86] PCT No.: PCT/JP98/00692

§ 371 Date: Jul. 28, 1999

§ 102(e) Date: Jul. 28, 1999

[87] PCT Pub. No.: WO98/37256

PCT Pub. Date: Aug. 27, 1998

[30] Foreign Application Priority Data

Feb. 20, 1997 [JP] Japan ................................. 9-036247

[51] Int. Cl.[7] .......................... C23C 14/34; C23C 14/54; H01L 21/203; H01L 21/285
[52] U.S. Cl. ............................... 204/298.03; 204/298.02; 204/298.12; 204/298.07; 204/298.08; 204/298.06; 323/371; 323/364; 323/369; 323/225; 323/259; 323/282; 323/285; 323/293
[58] Field of Search .................. 204/192.1, 192.12, 204/192.13, 298.02, 298.03, 298.12, 298.07, 298.08, 298.06; 427/8; 323/371, 364, 369, 225, 259, 282, 285, 293

[56] References Cited

U.S. PATENT DOCUMENTS

| 4,103,324 | 7/1978 | Vandervelden et al. ................. 323/910 |
| 4,276,591 | 6/1981 | Quick ....................................... 323/254 |
| 4,579,639 | 4/1986 | Enomoto et al. .................... 204/289.03 |
| 5,584,974 | 12/1996 | Sellers ................................. 204/192.13 |
| 5,651,865 | 7/1997 | Sellers ................................. 204/192.13 |

FOREIGN PATENT DOCUMENTS

| 2194831 | 8/1990 | Japan .............................. B01J 19/08 |
| 5311418 | 11/1993 | Japan ............................. C23C 14/34 |
| 7233472 | 9/1995 | Japan ............................. C23C 14/34 |
| 841636 | 2/1996 | Japan ............................. C23C 14/34 |
| 9137271 | 5/1997 | Japan ............................. C23C 14/34 |
| 2835322 | 10/1998 | Japan ............................. C23C 14/34 |

Primary Examiner—Alan Diamond
Attorney, Agent, or Firm—Volpe and Koenig, P.C.

[57] ABSTRACT

The present invention provides a sputtering power supply apparatus which realizes stable sputtering at a pressure lower than the discharge start pressure, so that scattering of sputtering particles due to collision with sputtering inert gas can be reduced, thereby improving the step coverage and the denseness of the sputter film. According to the present invention, there is provided a sputtering power supply apparatus comprising a sputtering DC power source (A), a constant current circuit (B) connected to the DC power source, a sputtering source (21) connected to the constant current circuit (B), and a control unit (11) for controlling a current output from the constant current circuit (B) so as to be a constant current.

20 Claims, 1 Drawing Sheet

POWER SUPPLY APPARATUS FOR SPUTTERING AND A SPUTTERING APPARATUS USING THE POWER SUPPLY APPARATUS

This application is a 371 of PCT/JP98/00692 filed Feb. 19, 1998.

TECHNICAL FIELD

The present invention relates to a power supply apparatus for sputtering used in a sputtering apparatus for forming a thin film on a semiconductor, electronic part and ornamental part, and to a sputtering apparatus using the power supply apparatus.

BACKGROUND ART

Widely spread is a technique to form a thin film on a semiconductor, electronic part, ornamental part, etc., by means of a sputtering apparatus using a sputtering source in which a magnet is placed on the rear surface of a target. In such a sputtering apparatus, an inert gas, for example, Ar, serving as a discharging gas, is introduced in a vacuum chamber. A sputtering source is arranged in the vacuum chamber. A negative voltage is applied to the sputtering source, thereby generating magnetron discharge and ionizing the discharging gas introduced in the vacuum chamber. The ionized argon positive ions are accelerated and collided with the target surface of the sputtering source, so that the target surface is sputter-evaporated. The sputter particles are deposited on a substrate, thereby forming a thin film made of the material of the target. This is called sputtering.

During the process of sputtering, the magnetron discharge may be changed to arc discharge. If magnetron discharge is shifted to arc discharge, sputtering cannot be performed.

Therefore, immediately after the arc discharge occurs, a reverse voltage pulse, which maintains the target at a positive potential, is slightly applied, so that occurrence of arc discharge is suppressed.

To prevent the aforementioned arc discharge, the following preventive measures have conventionally been taken:

(1) to insert a stabilizing resistor or a choke coil in serial with a load;

(2) to use an intermittent DC power source;

(3) to insert a choke coil for limiting a current, a resonating reactor and a capacitor between the DC power source and the load and apply a reverse voltage with vibration of a voltage and a current which are generated at the arc discharge, so that the arc discharge can be stopped;

(4) to clamp the reverse voltage described in (3) to stop the arc discharge in the reverse direction, thereby preventing the arc discharge more securely;

(5) to detect arc discharge and stop the output of the DC power source for a certain period of time;

(6) to detect arc discharge and apply a reverse voltage to the load for a certain period of time; and (7) to apply a reverse voltage to the load at regular intervals regardless of whether arc discharge is detected.

However, when the stabilizing resistor is inserted in parallel with the load in the circuit of (1), the resistor consumes a large amount of power and a sputtering power source of high power cannot be produced. Further, in the case of the choke coil, generally, the circuit of (3) has been made by parasitic elements (L, C) of the wire. This case has a problem that the discharge voltage and current vibrate due to the negative characteristic of the DC sputtering discharge.

Further, the circuit of (2) has a problem that control of the arc discharge is too late. Since the first side of the transformer is controlled by SCR and the second side is merely rectified by a diode, the sputtering discharge is intermitted at the frequency of an AC line, and the period of time between the occurrence and the extinction of arc discharge corresponds to the firing angle of the SCR. Thus, there is a problem that the arc discharge control delays.

Furthermore, the circuits of (3) to (7) have the following problem. When sputtering is performed under a gas pressure lower than the discharge start pressure, the DC sputtering discharge characteristic is of negative characteristic and the discharge voltage and current vibrate. This is because there is no stable point with respect to the negative resistance characteristic, since the power source characteristic from the viewpoint of load is not a constant current characteristic. The reason for vibration is that a smoothing capacitor is inserted in an output of the DC power source.

The discharge phenomenon has various hystereses. The hystereses include a discharge start voltage and a discharge voltage, and a discharge start pressure and a discharge stop pressure. When the discharge stop pressure is measured, it is impossible to obtain data as good reproducibility as that of the start pressure. When the cause was investigated, it was discovered that the magnetron discharge was stopped at a pressure lower than the discharge start pressure in the following cases:

(1) as the pressure is lowered, vibration of the discharge voltage and current occur, resulting in that the magnetron discharge is stopped;

(2) the arc discharge occurs, resulting in the stop of magnetron discharge; etc.

In other words, it was discovered that, since the magnetron discharge was stopped due to not only the characteristics of the magnetron sputter source, but also the vibration of the discharge voltage and current and the arc discharge, reproducibility of the discharge stop pressure could not be obtained.

As described above, with the conventional measures to cope with arc discharge, stable sputtering could not be performed at a pressure lower than the discharge start pressure.

DISCLOSURE OF INVENTION

The present invention was made in consideration of the above matters. Its object is to provide a sputtering power supply apparatus and a sputtering apparatus using the power supply apparatus, which realize stable sputtering at a pressure lower than the discharge start pressure, so that scattering of sputtering particles due to collision with sputtering inert gas can be reduced, thereby improving the step coverage and the denseness of the sputter film. According to an embodiment of the present invention, there is provided a power supply apparatus for sputtering, comprising: a DC power source for sputtering; a constant current circuit connected to the DC power source; a sputtering source connected to the constant current circuit; and a control unit for controlling a current output from the constant current circuit so as to be a constant current.

Therefore, even if the sputtering source exhibits the negative resistance characteristic, the voltage and the current of the sputtering source can be prevented from oscillating by the constant current circuit. For this reason, the sputtering source of a pressure lower than the discharge start pressure can stably generate magnetron discharge at a pressure exhibiting a negative resistance characteristic, so that stable sputtering can be performed.

Further, since the current is kept constant, the sputtering power can be calculated with the product of the average voltage excluding the reverse voltage and the constant current, not the average of products of the instantaneous values of the voltage and the current. Therefore, the sputtering can be performed with high accuracy of the power.

BEST MODE OF CARRYING OUT THE INVENTION

Figure 1:
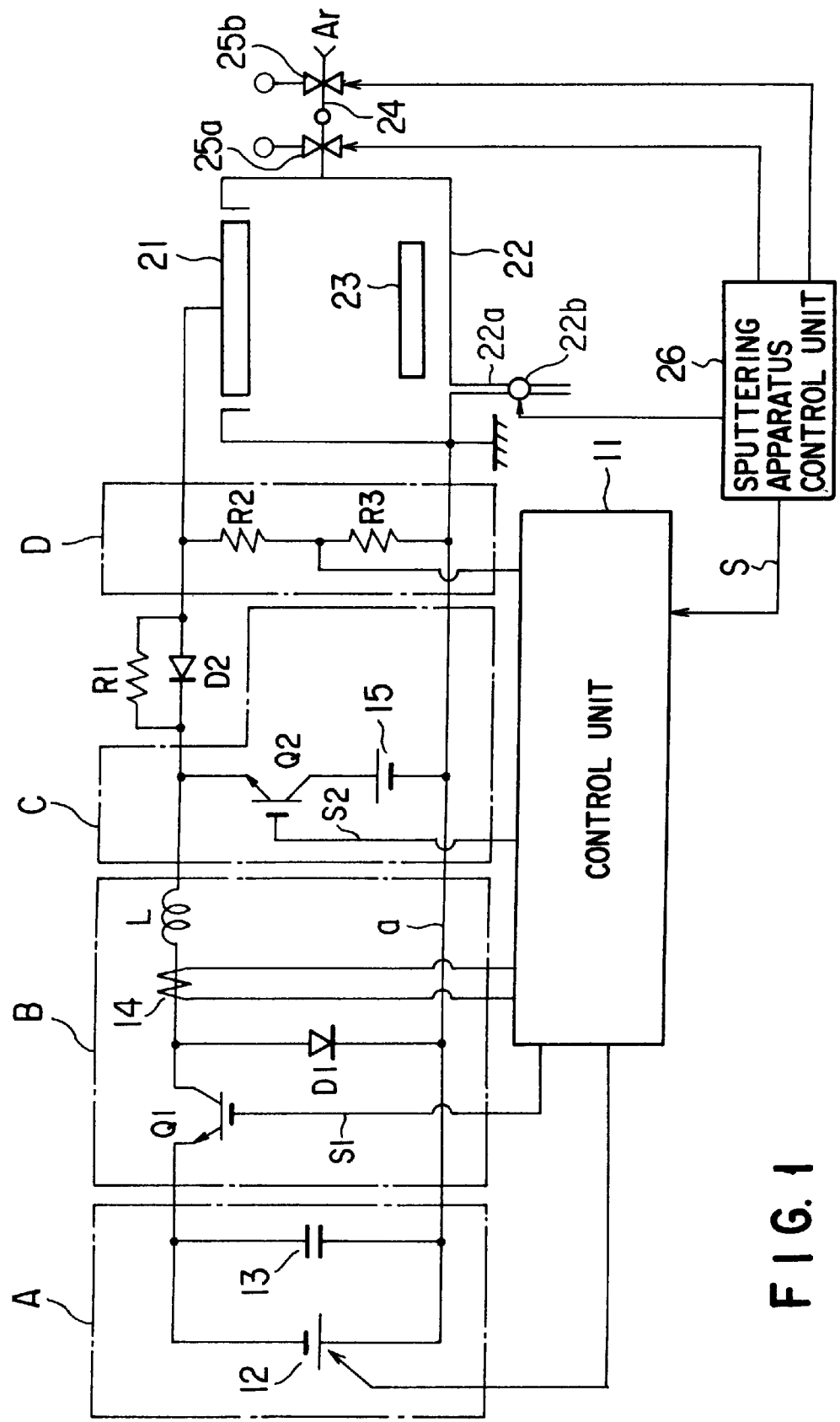
FIG. 1 is a schematic diagram showing a circuit of a sputtering power source apparatus and a sputtering apparatus using the power source apparatus according to an embodiment of the present invention.

An embodiment of the present invention will be described with reference to the drawing.

(Structure)

FIG. 1 is a schematic diagram showing a circuit of a sputtering power source apparatus and a sputtering apparatus using the power source apparatus. In FIG. 1, a reference numeral 11 denotes a control unit for controlling the sputtering power source apparatus.

A reference numeral 12 denotes a sputtering DC power source of, for example, 800V. A capacitor 13 is connected in parallel between both electrodes of the DC power source 12. The DC power source 12 and the capacitor 13 constitute a sputtering DC power source A.

The negative electrode of the DC power source 12 is connected to the emitter of a switching transistor Q1. The gate of the switching transistor Q1 is connected to the control unit 11.

A flywheel diode D1 is connected between the collector of the switching transistor Q1 and the positive electrode of the DC power source 12.

The collector of the switching transistor Q1 is connected to the emitter of a switching transistor Q2 in a reverse voltage applying circuit C through a choke coil L.

The transistor Q1, the diode D1 and the choke coil L constitute a constant current circuit B.

A current detector 14 is provided between the collector of the transistor Q1 and the choke coil L. Both ends of the current detector 14 are connected to the control unit 11.

The collector of the switching transistor Q2 is connected to the positive electrode of a reverse voltage source 15. The negative electrode of the reverse voltage source 15 is connected to an earth line a. The transistor Q2 and the reverse voltage source 15 constitute the reverse voltage applying circuit C.

The emitter of the transistor Q2 is connected to the cathode of the diode D2. A resistor R1 is connected in parallel with the diode D2.

The diode D2 and the resistor R1 constitute a reverse direction arc discharge preventing circuit.

The anode of the diode D2 is connected to the earth line a through resistors R2 and R3. A node between the resistors R2 and R3 is connected to the control unit 11.

The resistors R2 and R3 constitute a load voltage measuring circuit D serving as arc detecting means.

The anode of the diode D2 is connected to a sputtering source 21.

A reference numeral 22 denotes a vacuum chamber. A substrate 23 is placed in the vacuum chamber 22.

A pipe 24 is connected to the vacuum chamber 22. Opening/closing valves 25a and 25b are provided in the pipe 24. An exhaust pipe 22a is connected to the bottom of the vacuum chamber 22. A vacuum pump 22b is provided in the exhaust pipe 22a. The vacuum pump 22b is driven by a sputtering apparatus controlling unit 26.

The sputtering apparatus control unit 26 is connected to the control unit 11. The sputtering apparatus control unit 26 comprises a control circuit, etc., constituted by a computer, etc.

The sputtering apparatus control unit 26 activates and stops the vacuum pump 22b, controls opening/closing of the opening/closing valves 25a and 25b, and outputs a discharge start signal S to the control unit 11.

The aforementioned circuit shown in FIG. 1 is designed such that no static capacitance other than the parasitic static capacitance of the sputtering source and the static capacitance of the wire is provided between the constant current circuit B and the sputtering source 21.

In the case where static capacitance, other than the parasitic static capacitance of the sputtering source 21 and the static capacitance of the wire, is provided between the constant current circuit B and the sputtering source 21, if the sputtering source 21 has a negative resistance characteristic, the circuit may be oscillated by the parasitic inductance and the static capacitance of the wire, and the negative resistance characteristic.

(Operation)

An operation of the above embodiment of the present invention will now be described. First, the sputtering apparatus control unit 26 activates the vacuum pump 22b to exhaust the vacuum chamber 22 to be a vacuum. Then, the valve 25a is closed and the valve 25b is opened, so that the pipe 24 is filled with Ar gas. Thereafter, the valve 25b is closed. Then, the valve 25a is opened, and almost at the same time, a discharge start signal S is output to the control unit 11 of the sputtering power source apparatus. When the valve 25a is opened, an Ar gas pulse flows from the pipe 24 into the vacuum chamber 22, thereby increasing the pressure of the vacuum chamber 22 like pulses. At that time, a switching signal S1 is output from the control unit 11 to the base of the switching transistor Q1. As a result, a negative voltage of the DC power source 12 is applied to the sputtering source 21. For this reason, magnetron discharge occurs in the vacuum chamber 22.

The capacity of the vacuum chamber 22, the capacity of the pipe 24, the pressure of the introduced Ar gas and the exhaust rate of the vacuum pump 22b are selected, so that the pressure of the vacuum chamber 22 is set to exceed the sputter start pressure by the introduction of the gas pulse for a time required to enter the constant current operation.

By this time setting, if the DC power source 12 is operated in advance, the constant current circuit B is operating when the gas pulse is introduced. Therefore, even if the pressure of the sputtering chamber 22 is lowered, the magnetron discharge can continue.

The magnetron discharge generates argon plasma in the discharge space. Argon positive ions in the plasma are accelerated by the negative voltage difference and collided with the surface of the target of the sputtering source 21. The surface of the target is vaporized by the collision. The sputter particles are deposited on the substrate 23, thereby forming a thin film made of the material of the target. This is called sputtering.

The control unit 11 intermittently turns on the transistor Q1, and applies an output from the DC power source 12 to the choke coil L.

When normal magnetron discharge is occurring in the vacuum chamber 22, the current flowing through the constant current circuit B is detected by the current detector 14. The duty ratio of the switching signal S1 for turning on/off the transistor Q1 is varied to make the detected current constant, so that a constant current flows.

The flywheel diode D1 has a function for keeping the current flowing to the choke coil L, when the transistor Q1 is turned off.

The voltage applied to the sputtering source 21 is divided by the resistors R2 and R3 of the load voltage measuring circuit D, and thereafter input to the control unit 11. The control unit 11 measures the sputtering power supplied to the sputtering source 21 based on the load voltage measured by the load voltage measuring circuit D and the current value detected by the current detector 14. The duty ratio of the switching signal S1 output to the transistor Q1 is varied to make the sputtering power equal to a set value, thereby controlling a constant current value.

It is important to measure the sputtering power with high accuracy for increasing the process accuracy. The power is obtained by the equation: Power=Voltage×Current. If both the load voltage and the load current oscillate, an accurate power cannot be obtained unless (voltage×Current) is calculated instantaneously at that moment. In this embodiment, since the current is kept constant by the constant current circuit B, the multiplication result is unchanged, even if it is calculated after averaging the voltages. If a voltage in the period when the reverse voltage is applied is included in the average, it follows that a voltage in the period when sputtering is not performed is included in the average. Therefore, a voltage averaging circuit for averaging voltages on the assumption of voltage=0 in that period is used, only the sputtering power can be obtained.

The sputtering voltage is normally 300V or higher, whereas the arc discharging voltage is 150V or lower. Therefore, it is possible to judge whether the sputtering is normally performed or arc discharge occurs by detecting the load voltage applied to the sputtering source 21 by the load voltage measuring circuit D.

When the load voltage measured by the load voltage measuring circuit D is 150V or lower, the control unit 11 judges that arc discharge occurs in the vacuum chamber 22, and outputs a switching signal S2 to the base of the switching transistor Q2.

As a result, the transistor Q2 is turned on only for several microseconds and applies a voltage from the reverse voltage source 15 to the sputtering source 21 for the several microseconds, thereby eliminating the arc discharge which has occurred in the vacuum chamber 22.

The negative voltage is applied to the sputtering source 21, after the vacuum chamber 22 is made vacuum and the gas pulse is introduced in the vacuum chamber 22, so that the current output from the constant current circuit B can be controlled to be constant. Further, when the load voltage measuring circuit detects occurrence of arc discharge in the sputtering source 21, the reverse voltage output from the reverse voltage applying circuit C is applied to the sputtering source 21. Therefore, magnetron discharge can be continued in the vacuum chamber 22 only by introducing the gas pulse in the vacuum chamber 22 first.

If the vacuum chamber 22 is always kept vacuum by the vacuum pump, even if the inert gas is entirely discharged from the vacuum chamber, magnetron discharge is continued in the vacuum chamber 22. This is because sputtered atoms of the material of the target are ionized instead of the inert gas, so that self-sputtering is performed.

With the above operation, sputtering can be performed in a state where there is no inert gas in the vacuum chamber 22. Therefore, the metal atoms released from the target of the sputtering source 21 can be deposited on the substrate without colliding with inert gas.

For example, when pulsed Ar gas is first introduced in the vacuum chamber 22, if the target of the sputtering source 21 is made of Cu, Cu can be sputtered on the substrate 23 without supplying additional Ar gas to the vacuum chamber 22.

Thus, even if the substrate 23 is sufficiently separated from the target of the sputtering source 21, the atoms of the target can be deposited on the substrate, since there is little scattering due to the argon gas. Therefore, sputtering can be performed with respect to a large substrate or an article having a complicated shape.

In the case where the reverse voltage source 15 is incorporated, the current flows through the resistor R1. Therefore, the reverse voltage source 15 can be applied to the sputtering source 21 through a current restricting impedance, R1, by setting the resistor R1 to a suitable value. As a result, occurrence of the arc discharge in the reverse direction can be prevented.

After the reverse voltage source 15 is applied to the sputtering source 21 for several microseconds, if the load voltage detected by the load voltage measuring circuit D is a voltage which generates arc discharge of, for example, 150V or lower, the transistor Q2 is turned on for several microseconds again, thereby applying the reverse voltage 15 to the sputtering source for several microseconds. This operation is repeated until the load voltage detected by the load voltage detecting circuit D becomes equal to or higher than the sputtering voltage, for example, 300V.

If the apparatus is controlled so as not change the value of a constant current obtained by the power calculation during the arc discharge, the current flowing through the choke coil is kept constant. Therefore, the present invention does not have the problem of the conventional circuit that, when a reverse voltage is applied for a long time or repeated many times, the circuit current flowing through the choke coil L is increased, resulting in that the control is impossible due to magnetic saturation of the iron core of the choke coil L.

[Another Example of Use]

In the above embodiment, the reverse voltage source 15 is applied to the sputtering source 21 when occurrence of arc discharge is detected by the load voltage measuring circuit D. However, even if occurrence of arc discharge is not detected by the load voltage detecting circuit D, the reverse voltage source 15 may be periodically applied to the sputtering source 21, so that occurrence of arc discharge can be prevented.

Further, in the above description, the control unit 11 and the sputtering apparatus control unit 26 are distinct apparatuses. However, it is obvious that they can be one integral control unit.

(Advantages of the Invention)

According to the invention of claim 1, even if the sputtering source exhibits the negative resistance characteristic, the voltage and the current of the sputtering source can be prevented from oscillating by the constant current circuit. Therefore, the sputtering source of a pressure lower than the discharge start pressure can stably generate magnetron discharge at a pressure exhibiting a negative resistance characteristic, so that stable sputtering can be performed.

Further, since the current is kept constant, the sputtering power can be calculated with the product of the average voltage excluding the reverse voltage and the constant current, not the average of the products of the instantaneous values of the voltage and the current. Therefore, the sputtering can be performed with high accuracy of the power.

According to the invention of claim 2, the same advantage as that of the invention of claim 1 can be obtained. In addition, when arc discharge is detected by the load voltage measuring circuit, a reverse voltage is applied to the sputtering source by the reverse voltage applying circuit. Therefore, occurrence of arc discharge can be prevented.

According to the invention of claim 3, the same advantages as those of the invention of claim 2 can be obtained. In addition, since the reverse direction arc discharge preventing circuit is provided, reverse direction arc discharge is prevented from occurring when the reverse voltage is applied, and the possibility of arc discharge is lowered when the voltage returns to the sputtering polarity.

According to the invention of claims 4 and 5, the same advantages as those of the invention of claim 3 can be obtained.

According to the invention of claim 6, the same advantages as those of the invention of claims 1 to 5 can be obtained. In addition, the static capacitance between the constant current circuit and the sputtering source is minimized, thereby preventing the discharge voltage and current from oscillating due to the inductance and the static capacitance of the wire and the negative resistance characteristic of the sputtering source.

According to the invention of claim 7, the sputtering source having a negative resistance characteristic lower than the discharge start pressure can be stably sputtered by the constant current control. Therefore, even if the target of the sputtering source and the substrate are spaced at a distance, scattering due to Ar gas is reduced. For this reason, sputtering can be performed with respect to a large substrate or an article of a complicated shape.

According to the invention of claim 8, the same advantage as that of the invention of claim 7 can be obtained. In addition, since a discharge stop due to arc discharge can be prevented, a stable manufacturing apparatus can be provided.

According to the invention of claim 9, there is provided a more stable manufacturing apparatus having a higher arc preventing effect than that of the invention of claim 8.

According to the invention of claims 10 and 11, the same advantage as that of the invention of claim 9 can be obtained. In addition, the arc discharge preventing effect is optimized, so that a manufacturing apparatus for performing stable sputtering can be provided.

According to the invention of claim 12, the same advantages as those of the invention of claims 7 to 11 can be obtained. In addition, the static capacitance between the constant current circuit and the sputtering source is minimized, thereby preventing the discharge voltage and current from oscillating due to the inductance and the static capacitance of the wire and the negative resistance characteristic of the sputtering source.

What is claimed is:

1. A power supply apparatus for sputtering, comprising:
   a DC power source for sputtering;
   a constant current circuit connected to the DC power source;
   a sputtering source connected to the constant current circuit; and
   a control unit for controlling the current output from the constant current circuit so as to be a constant current.

2. The power supply apparatus for sputtering according to claim 1, wherein no static capacitance other than a parasitic static capacitance of the sputtering source and a wire static capacitance is provided between the constant current circuit and the sputtering source.

3. A power supply apparatus for sputtering, comprising:
   a DC power source for sputtering;
   a constant current circuit connected to the DC power source;
   a sputtering source connected to the constant current circuit;
   a reverse voltage applying circuit for applying a reverse voltage to the sputtering source;
   a load voltage measuring circuit for detecting arc discharge which occurs in the sputtering source; and
   a control unit for controlling the current output from the constant current circuit so as to be a constant current, and causing the reverse voltage applying circuit to apply the reverse voltage to the sputtering source, when the load voltage measuring circuit detects that arc discharge occurs in the sputtering source.

4. The power supply apparatus for sputtering according to claim 3, wherein no static capacitance other than a parasitic static capacitance of the sputtering source and a wire static capacitance is provided between the constant current circuit and the sputtering source.

5. A power supply apparatus for sputtering, comprising:
   a DC power source for sputtering;
   a constant current circuit connected to the DC power source;
   a sputtering source connected to the constant current circuit;
   a reverse voltage applying circuit for applying a reverse voltage to the sputtering source;
   a load voltage measuring circuit for detecting arc discharge which occurs in the sputtering source;
   a reverse direction arc discharge preventing circuit for preventing occurrence of reverse direction arc discharge, connected between the reverse voltage applying circuit and a target of the sputtering source and having a forward direction impedance connected in a direction in which a sputtering discharge current flows and a reverse direction impedance connected in parallel to the forward direction impedance; and
   a control unit for controlling the current output from the constant current circuit so as to be a constant current, and causing the reverse voltage applying circuit to apply the reverse voltage to the sputtering source, when the load voltage measuring circuit detects that arc discharge occurs in the sputtering source.

6. The power supply apparatus for sputtering according to claim 5, wherein no static capacitance other than a parasitic static capacitance of the sputtering source and a wire static capacitance is provided between the constant current circuit and the sputtering source.

7. The power supply apparatus for sputtering according to claim 5, wherein in the reverse direction arc discharge preventing circuit, the reverse direction impedance is greater than the forward direction impedance.

8. The power supply apparatus for sputtering according to claim 7, wherein no static capacitance other than a parasitic static capacitance of the sputtering source and a wire static capacitance is provided between the constant current circuit and the sputtering source.

9. The power supply apparatus for sputtering according to claim 5, wherein in the reverse direction arc discharge preventing circuit, the forward direction impedance comprises a diode and the reverse direction impedance comprises a resistor.

10. The power supply apparatus for sputtering according to claim 9, wherein no static capacitance other than a parasitic static capacitance of the sputtering source and a wire static capacitance is provided between the constant current circuit and the sputtering source.

11. A sputtering apparatus comprising:
   a vacuum chamber connected to a ground;
   a sputtering source arranged in the vacuum chamber;
   a substrate arranged in the vacuum chamber so as to face a target of the sputtering source;
   a DC power source for sputtering;
   a constant current circuit connected to the DC power source and the sputtering source;
   a sputtering apparatus control unit for controlling an opening and closing valve to discharge the vacuum chamber to be a vacuum and introduce a gas pulse into the vacuum chamber and outputting a discharge start signal to a control unit; and
   a control unit, to which the discharge start signal is input from the sputtering apparatus control unit, for controlling the current output from the constant current circuit to be constant.

12. The sputtering apparatus according to claim 11, wherein no static capacitance other than a parasitic static capacitance of the sputtering source and a wire static capacitance is provided between the constant current circuit and the sputtering source.

13. A sputtering apparatus comprising:
   a vacuum chamber connected to a ground;
   a sputtering source arranged in the vacuum chamber;
   a substrate arranged in the vacuum chamber so as to face a target of the sputtering source;
   a DC power source for sputtering;
   a constant current circuit connected to the DC power source and the sputtering source;
   a reverse voltage applying circuit for applying a reverse voltage to the sputtering source;
   a load voltage measuring circuit for detecting arc discharge which occurs in the sputtering source;
   a sputtering apparatus control unit for controlling an opening and closing valve to discharge the vacuum chamber to be a vacuum and introduce a gas pulse into the vacuum chamber and outputting a discharge start signal to a control unit; and
   a control unit, to which the discharge start signal is input from the sputtering apparatus control unit, for controlling the current output from the constant current circuit to be constant and causing the reverse voltage applying circuit to apply the reverse voltage to the sputtering source, when the load voltage measuring circuit detects that arc discharge occurs in the sputtering source.

14. The sputtering apparatus according to claim 13, wherein no static capacitance other than a parasitic static capacitance of the sputtering source and a wire static capacitance is provided between the constant current circuit and the sputtering source.

15. A sputtering apparatus comprising:
   a vacuum chamber connected to a ground;
   a sputtering source arranged in the vacuum chamber;
   a substrate arranged in the vacuum chamber so as to face a target of the sputtering source;
   a DC power source for sputtering;
   a constant current circuit connected to the DC power source and the sputtering source;
   a reverse voltage applying circuit for applying a reverse voltage to the sputtering source;
   a load voltage measuring circuit for detecting arc discharge which occurs in the sputtering source;
   a reverse direction arc discharge preventing circuit for preventing occurrence of reverse direction arc discharge, connected between the reverse voltage applying circuit and a target of the sputtering source, the reverse direction arc discharge preventing circuit having a forward direction impedance connected in a direction in which a sputtering discharge current flows and a reverse direction impedance connected in parallel to the forward direction impedance;
   a sputtering apparatus control unit for controlling an opening and closing valve to discharge the vacuum chamber to be a vacuum and introduce a gas pulse into the vacuum chamber and outputting a discharge start signal to a control unit; and
   a control unit, to which the discharge start signal is input from the sputtering apparatus control unit, for controlling the current output from the constant current circuit to be constant and causing the reverse voltage applying circuit to apply the reverse voltage to the sputtering source, when the load voltage measuring circuit detects that arc discharge occurs in the sputtering source.

16. The sputtering apparatus according to claim 15, wherein no static capacitance other than a parasitic static capacitance of the sputtering source and a wire static capacitance is provided between the constant current circuit and the sputtering source.

17. The sputtering apparatus according to claim 15, wherein in the reverse direction arc discharge preventing circuit, the reverse direction impedance is greater than the forward direction impedance.

18. The sputtering apparatus according to claim 17, wherein no static capacitance other than a parasitic static capacitance of the sputtering source and a wire static capacitance is provided between the constant current circuit and the sputtering source.

19. The sputtering apparatus according to claim 15, wherein in the reverse direction arc discharge preventing circuit, the forward direction impedance comprises a diode and the reverse direction impedance comprises a resistor.

20. The sputtering apparatus according to claim 19, wherein no static capacitance other than a parasitic static capacitance of the sputtering source and a wire static capacitance is provided between the constant current circuit and the sputtering source.

* * * * *